(12) United States Patent
Matsui

(10) Patent No.: US 7,345,941 B2
(45) Date of Patent: Mar. 18, 2008

(54) SEMICONDUCTOR MEMORY DEVICE AND METHOD OF REFRESHING THE SEMICONDUCTOR MEMORY DEVICE

(75) Inventor: Yoshinori Matsui, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 160 days.

(21) Appl. No.: 11/049,732

(22) Filed: Feb. 4, 2005

(65) Prior Publication Data
US 2005/0169084 A1 Aug. 4, 2005

(30) Foreign Application Priority Data
Feb. 4, 2004 (JP) .............................. 2004-028272

(51) Int. Cl.
*G11C 7/00* (2006.01)
(52) U.S. Cl. .................. 365/222; 365/233; 365/189.07
(58) Field of Classification Search ................ 365/222, 365/233, 189.07
See application file for complete search history.

(56) References Cited

U.S. PATENT DOCUMENTS

| | | | |
|---|---|---|---|
| 5,629,898 A | 5/1997 | Idei et al. | |
| 6,603,694 B1 * | 8/2003 | Frankowsky et al. | 365/222 |
| 6,614,704 B2 * | 9/2003 | Dobler et al. | 365/222 |
| 6,678,195 B2 * | 1/2004 | Hidaka | 365/200 |
| 6,721,225 B2 * | 4/2004 | Tsukude | 365/222 |
| 7,095,669 B2 * | 8/2006 | Oh | 365/222 |
| 7,167,403 B2 * | 1/2007 | Riho et al. | 365/222 |

FOREIGN PATENT DOCUMENTS

JP H08-306184 A 11/1996

* cited by examiner

*Primary Examiner*—David Lam
(74) *Attorney, Agent, or Firm*—Sughrue Mion, PLLC

(57) ABSTRACT

When a semiconductor memory device enters a refresh mode, retention times of memory cells are measured for each word line. A plurality of refresh cycles are set in correspondence to the retention times of the memory cells. According to the refresh cycles, the memory cells are refreshed.

18 Claims, 8 Drawing Sheets

11 SUB MEMORY CELL ARRAY

SEMICONDUCTOR MEMORY DEVICE AND METHOD OF REFRESHING THE SEMICONDUCTOR MEMORY DEVICE

This application claims priority to prior Japanese patent application JP 2004-28272, the disclosure of which is incorporated herein by reference.

BACKGROUND OF THE INVENTION

This invention relates to a semiconductor memory device and, in particular, to a large-capacity random access semiconductor memory device and a method of refreshing the same.

As a semiconductor memory device, particularly, as a large-capacity random access semiconductor memory device, a dynamic random access memory (hereinafter abbreviated to DRAM) is known. The DRAM holds information as electric charges stored in capacitors of memory cells. It is therefore required to perform a refresh operation by reading the information before the electric charges fade out, amplifying the information, and restoring the information into its original state. The electric charges stored in the capacitors of the memory cells in the DRAM fade out after lapse of certain time periods which may be called information holding times or retention times. The retention times are different from cell to cell and are not constant.

The retention times are continuously distributed from a short time to a long time. This is mainly because the electric charges as "HIGH level" written in the memory cells fade out due to junction leakage. The retention times are also affected by surface leakage and relationships with adjacent cells. Accordingly, the retention times in one DRAM are long in most of the memory cells and are short in only a part of the memory cells. In existing DRAMs, in order to assure a reliable operation for all of the memory cells, a refresh cycle is determined with reference to short retention times of only a part of the memory cells. Therefore, for most of the memory cells having long retention times, the refresh operation is excessively frequently carried out. As a result, power consumption for the refresh operation is uselessly increased.

In order to save power consumption in the refresh operation, proposal is made of a method of setting a plurality of different refresh cycles for example, see Japanese Unexamined Patent Application Publication (JP-A) No. H8-306184 (corresp. to U.S. Pat. No. 5,629,898).

FIG. 1 shows a flow chart of a refresh operation according to the above-mentioned method. An adaptive refresh controller has a read-only memory (ROM) which stores refresh cycle setting information indicating short-cycle refreshing or long-cycle refreshing for each word line. In the short-cycle refreshing, the refresh operation is carried out in a reference cycle T as a short cycle. In the long-cycle refreshing, the refresh operation is carried out in a long cycle nT corresponding to n times the short cycle T. When a self-refresh mode is entered, a self-refresh operation is carried out in the long cycle nT or the short cycle T for each word line under control of the adaptive refresh controller.

When the self-refresh mode is entered, all word lines are refreshed according to addresses generated in the DRAM at first as the long-cycle refreshing in the long cycle nT. Then, after lapse of the time T corresponding to the short cycle T, the short-cycle refreshing in the short cycle T is carried out for some of the word lines. Specifically, among word lines selected by addresses generated in the DRAM, those word lines to be subjected to the long-cycle refreshing in the long cycle nT according to the refresh cycle setting information are not activated in response to an inhibit signal from the adaptive refresh controller. Thus, those word lines skip the short-cycle refreshing and are not refreshed. On the other hand, the remaining word lines to be subjected to the short-cycle refreshing in the short cycle T are refreshed. After (n−1) times repetition of the short-cycle refreshing, all word lines are refreshed again according to addresses generated in the DRAM as the long-cycle refreshing in the long cycle nT.

According to the above-mentioned process, only a part of the word lines determined to be subjected to the short-cycle refreshing are refreshed in every short cycle T while most of the word lines determined to be subjected to the long-cycle refreshing are refreshed in the long cycle nT. Thus, as compared with the case where all of the word lines are refreshed in every short cycle T, power consumption is considerably reduced.

At present, the semiconductor memory device is more and more increased in capacity. Further, the semiconductor memory device is used in a mobile terminal energized by a battery. Under the circumstances, a demand for low power consumption of the semiconductor memory device becomes more and more strict. It is therefore desired to reduce power consumption during the refresh operation specific to the DRAM. Traditionally, the retention time is measured for each word line in a production process. With reference to the result of measurement, the refresh cycle is determined as the short cycle T or the long cycle nT. The refresh time setting information indicative of the short cycle T or the long cycle nT thus determined is memorized in a PROM such as a fuse. Thus, by adaptively setting the short cycle or the long cycle as the refresh cycle, power consumption is saved.

However, the semiconductor memory device used in the mobile terminal having a small size and a thin profile is required to be further reduced in size and profile, as compared with semiconductor memory devices used in other electric apparatuses. In particular, in the semiconductor memory device used in a multi-stack package, silicon chips are reduced in thickness. In case where the silicon chips are reduced in thickness, the semiconductor memory device is susceptible to a stress during packaging or to an influence of reflowing during mounting to a printed board. If the retention times of the memory cells are varied during mounting to the printed board or during use, it is impossible to hold the data by the refresh operation in the refresh cycle according to the information preliminarily written in the PROM during production. As a result, the semiconductor memory device becomes defective.

SUMMARY OF THE INVENTION

It is therefore an object of this invention to provide a semiconductor memory device and a method of refreshing the semiconductor memory device, which are capable of carrying out a reasonable, reliable, and low-power-consumption refresh operation according to a retention time for a data pattern written in each memory cell.

In the semiconductor memory device according to this invention, a semiconductor memory device including a plurality of memory cells, wherein, when a semiconductor memory device enters a refresh mode, retention times of memory cells are measured for each word line. A plurality of refresh cycles are set in correspondence to the retention times of the memory cells. According to the refresh cycles, the memory cells are refreshed.

In the semiconductor memory device according to this invention, the memory cells are arranged in a matrix fashion to form a sub memory cell array, further the sub memory cell array comprising a data saving memory cell array having a data saving word line, memory cell data on a check word line being copied directly from sense amplifiers to memory cells on a data saving word line in the sub memory cell array.

In the method of refreshing a semiconductor memory device according to this invention, the method comprising the steps of making the semiconductor memory device enter a refresh mode, measuring retention times of memory cells for each word line, setting a plurality of refresh cycles corresponding to the retention times, and carrying out a refresh operation according to the refresh cycles.

In the semiconductor memory device according to this invention, the retention times for the data patterns written in the memory cells are measured upon entry into the refresh mode. By carrying out refreshing in a plurality of cycles corresponding to the retention times, a refresh current is saved. As the retention times for the data patterns written in the memory cells are measured, it is possible to eliminate an influence of variation in retention times for the data patterns written in the memory cells due to the data patterns in adjacent memory cells. According to this invention, the semiconductor memory device and the method of refreshing the semiconductor memory device which are capable of carrying out a reasonable, reliable, and low-power-consumption refresh operation are obtained.

DESCRIPTION OF PREFERRED EMBODIMENT

Figure 1:
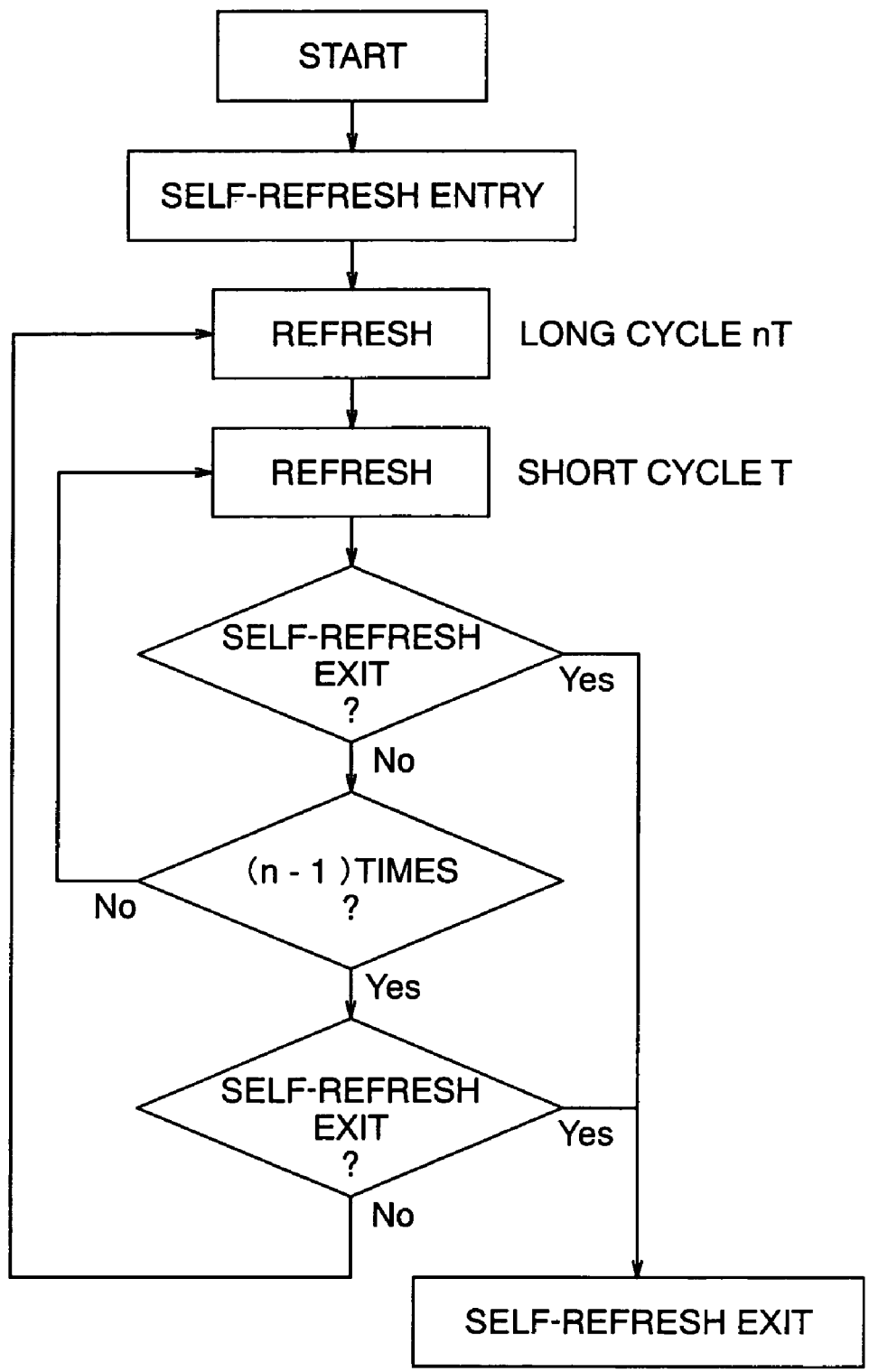
FIG. 1 is a flow chart for describing a traditional refresh operation.

Now, description will be made of an embodiment of this invention with reference to the drawing.

Figure 2:
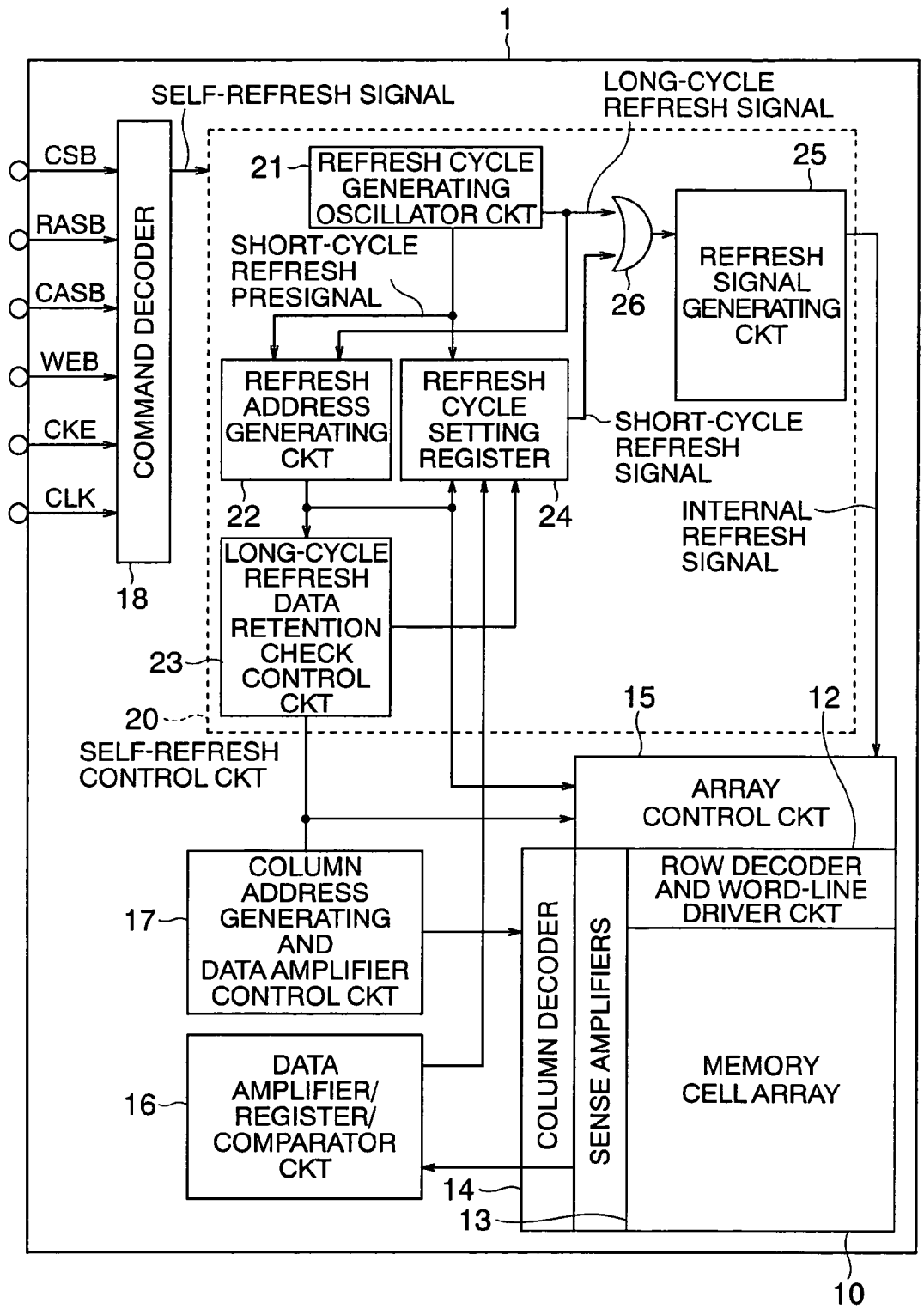
FIG. 2 is a block diagram of a semiconductor memory device according to an embodiment of this invention.
Figure 5:
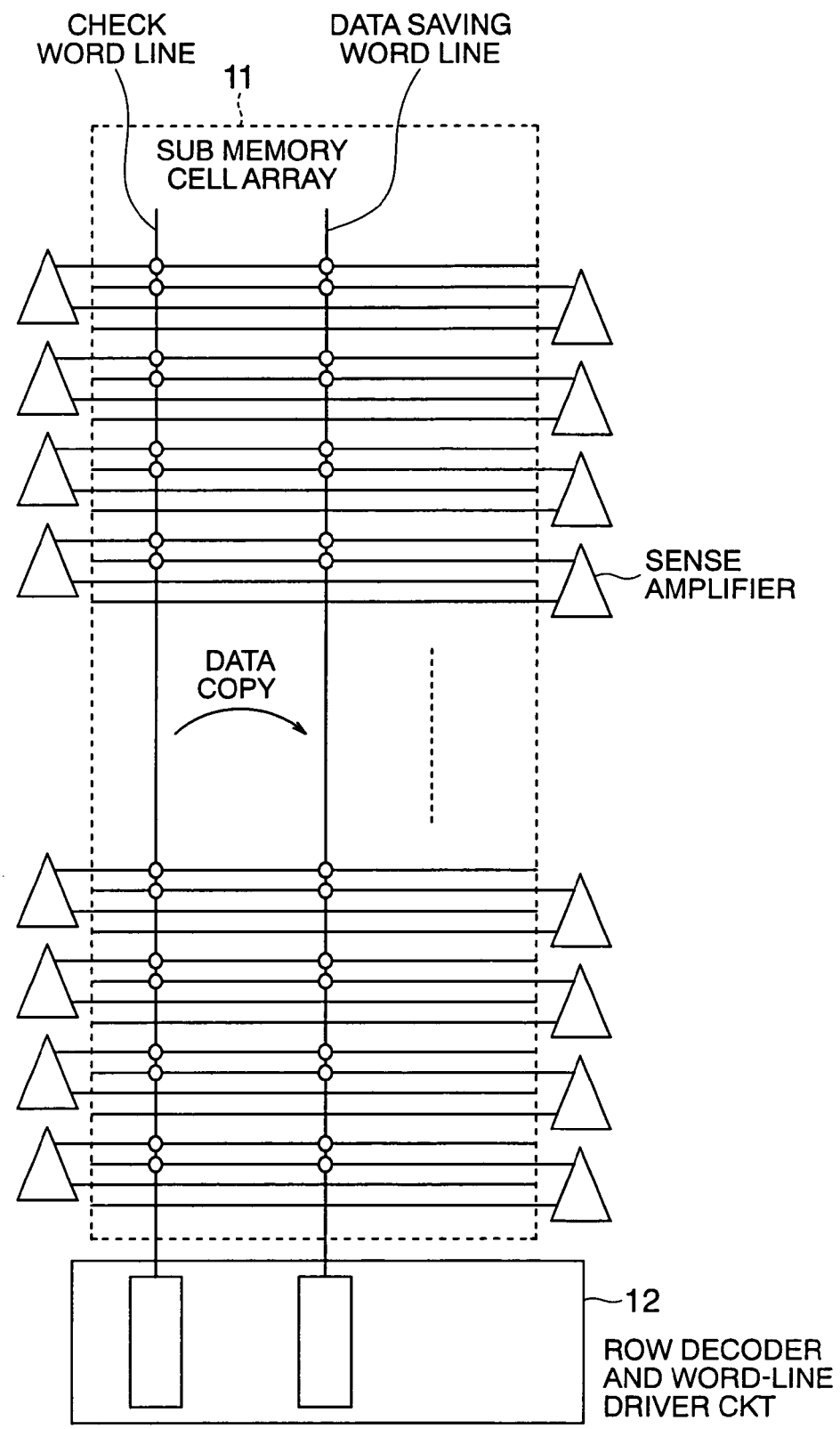
FIG. 5 is a view showing a structure of a sub memory cell array.

At first referring to FIGS. 2 and 5, a semiconductor memory device 1 according to the embodiment of this invention will be described. In FIG. 2, the structure in connection with one bank is shown. The semiconductor memory device 1 comprises a memory cell array 10 including a plurality of memory cells arranged in a matrix fashion and has a plurality of sub memory cell arrays 11. The memory cell array 10 includes a plurality of word lines connected to a row decoder and word-line driver circuit 12 for selecting the word lines and a plurality of bit lines connected to a plurality of sense amplifiers 13. The sense amplifiers 13 are connected via a column decoder 14 to data amplifiers which will later be described.

The semiconductor memory device 1 further comprises an array control circuit 15. Supplied with refresh addresses from a refresh address generating circuit 22 and a control signal from a long-cycle refresh data retention check control circuit 23, the array control circuit 15 selectively activates the sub memory cell arrays 11 of the memory cell array 10 and delivers row addresses upon long-cycle refresh data retention check, long-cycle refreshing, and short-cycle refreshing to the row decoder and word-line driver circuit 12.

A data amplifier/register/comparator circuit 16 includes the data amplifiers for transmitting and receiving data to and from the sense amplifiers 13 through the column decoder 14, a plurality of data registers for storing memory cell data on a check word line, and a comparator circuit for comparing data in the data registers and data on a data saving word line. The data amplifier/register/comparator circuit 16 produces a refresh cycle setting signal. A column address generating and data amplifier control circuit 17 is supplied with the control signal from the long-cycle refresh data retention check control circuit 23 and produces column addresses and a control signal. A command decoder 18 decodes input signals through external terminals to produce a control signal as a self-refresh signal and is shared throughout a whole of the semiconductor memory device.

A self-refresh control circuit 20 controls a self-refresh operation. The self-refresh control circuit 20 comprises the following circuits. A refresh-cycle generating oscillator circuit 21 generates a refresh reference cycle signal of a reference cycle T and produces a long-cycle refresh signal and a short-cycle refresh presignal. The refresh address generating circuit 22 is supplied with the long-cycle refresh signal and the short-cycle refresh presignal and internally produces the refresh addresses. The long-cycle refresh data retention check control circuit 23 is supplied with the refresh addresses from the refresh address generating circuit 22 and delivers the control signal to the array control circuit 15, the column address generating and data amplifier control circuit 17, and a refresh cycle setting register 24.

Supplied with the short-cycle refresh presignal, the refresh cycle setting signal from the data amplifier/register/comparator circuit 16, the refresh addresses from the refresh address generating circuit 22, and the control signal from the long-cycle refresh data retention check control circuit 23, the refresh cycle setting register 24 stores the refresh cycle setting signal indicative of whether or not short-cycle refreshing is to be executed for each word line and produces a short-cycle refresh signal. A logical circuit 26 is supplied with the long-cycle refresh signal and the short-cycle refresh signal and produces a control signal indicative of whether or not refreshing is to be executed. A refresh signal generating circuit 25 is supplied with the control signal from the logical circuit 26 and produces an internal refresh signal indicative of whether or not a selected word line is to be refreshed.

The memory cell array 10 described herein does not mean a structure physically arranged in a region surrounded by the row decoder and word-line driver circuit and the sense amplifiers but is a memory cell array forming one bank. The memory cell array 10 comprises a plurality of the sub memory cell arrays 11. The sub memory cell arrays 11 are cell arrays adapted to the refresh operation and can individually be refreshed. In the refresh operation in one sub memory cell array, a single word line is selected and the memory cells on the selected word line are collectively and simultaneously refreshed by the sense amplifiers. Thus, the memory cell array 10 is a logical cell array.

In the following, a 512 Mbit DDR-DRAM (4 banks, 32 bits) will be described by way of example. The banks in the DRAM are independently operable and are same in structure. Therefore, only one bank will be described. The memory cell array 10 of one bank has 128 Mbits of memory cells. The number of the data amplifiers is equal to 64. The memory cell array 10 is divided into 16 sub memory cell arrays 11. Each of the sub memory cell arrays 11 comprises a plurality of sense amplifiers of 8 k and a plurality of word lines of 1 k. For brevity of description, the block diagram corresponding to one bank is illustrated in FIG. 2. The semiconductor memory device 1 further comprises a data input, an address input, a read/write control circuit, a row address generating circuit, and other circuit blocks, like a typical semiconductor memory device. However, these components are not directly related to the gist of this invention and are similar to those of the typical semiconductor memory device. Therefore, these components are not illustrated and described herein.

Figure 3:
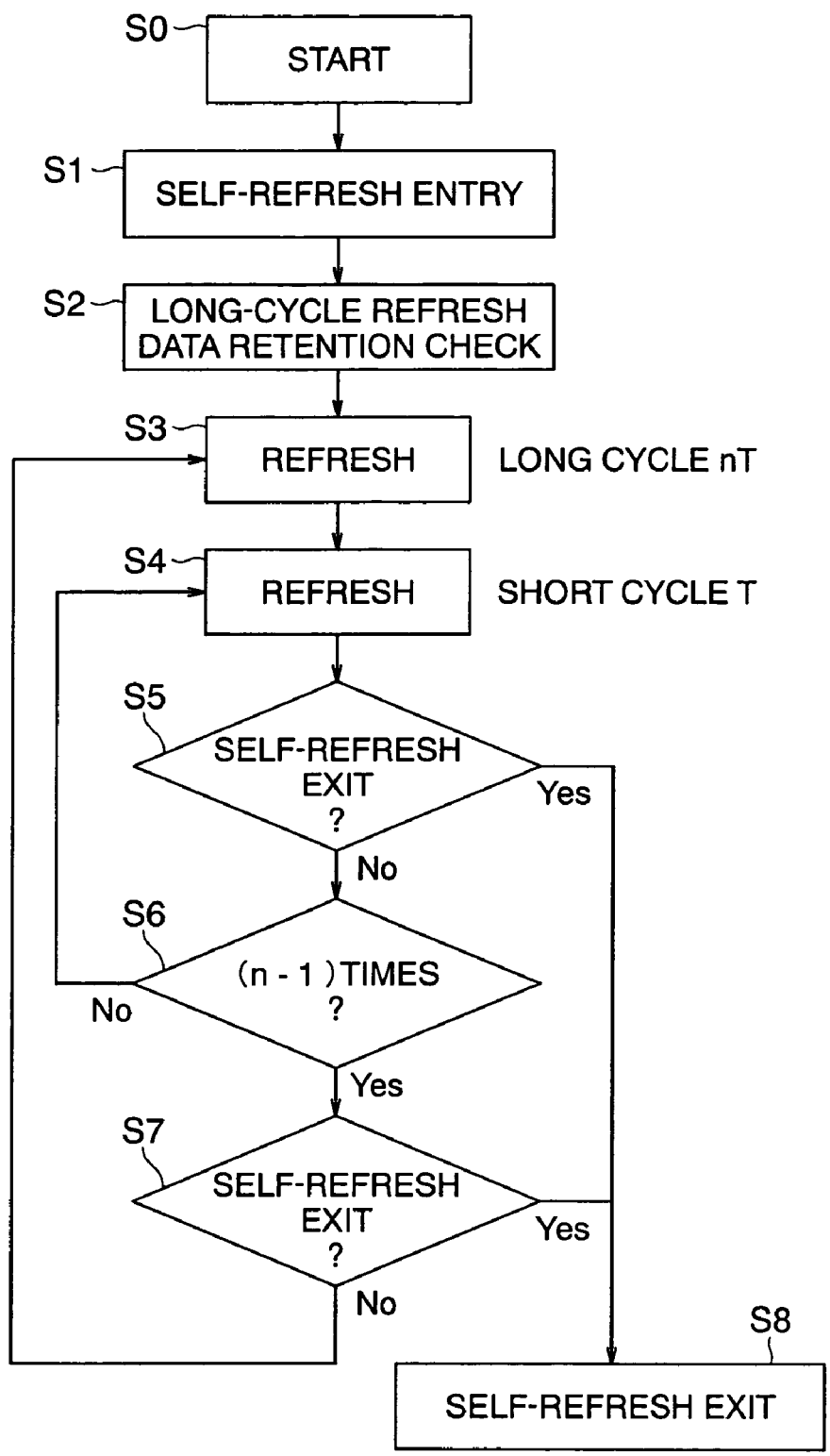
FIG. 3 is a flow chart for describing a refresh operation in the semiconductor memory device illustrated in FIG. 2.

Referring to FIGS. 2 and 3, description will be made of an overall flow of the refresh operation. As a method of refreshing the semiconductor memory device by automatically generating addresses inside the semiconductor memory device, auto-refreshing and self-refreshing are known. Hereinafter, description will be made of the self-refreshing for which this invention is particularly effective.

The command decoder 18 produces the self-refresh signal and supplies the self-refresh signal to the self-refresh control circuit 20. Then, the semiconductor memory device 1 enters a self-refresh mode (step S1). The refresh cycle generating oscillator circuit 21 generates the refresh reference cycle signal. In response to the control signal produced by the long-cycle refresh data retention check control circuit 23, long-cycle refresh data retention check is executed (step S2). In accordance with the addresses generated by the refresh address generating circuit 22, a retention time for each word line is measured. With reference to the retention time of each word line, the short-cycle refreshing or the long-cycle refreshing is selected for each word line and stored in the refresh cycle setting register 24.

Herein, the short-cycle refreshing is a refresh operation executed at a time interval as a short cycle T. The long-cycle refreshing is a refresh operation executed at a time interval as a long cycle nT corresponding to n times the short cycle T. For each word line, the retention times of the memory cells are measured. For the word lines having the retention times not shorter than the long cycle nT, the long-cycle refreshing is set and executed. For the word lines having the retention times shorter than the long cycle nT, the short-cycle refreshing is set and executed.

Next, the long-cycle refreshing in the long cycle nT is executed (step S3). In the long-cycle refreshing, all word lines are refreshed according to the addresses generated by the refresh address generating circuit 22. At a time instant after lapse of the time T corresponding to the short cycle T, the short-cycle refreshing is executed for some of the word lines (step S4). Among the word lines selected by the addresses generated by the refresh address generating circuit 22, those word lines set to the long-cycle refreshing in the long cycle nT skip the short-cycle refreshing and are not refreshed. This is because the internal refresh signal is not activated by the short-cycle refresh signal from the refresh cycle setting register 24. In the short-cycle refreshing, only the word lines set to the short-cycle refreshing are refreshed.

In order to adapt to a change in setting of the semiconductor memory device during the above-mentioned operation, judgment is made about whether or not setting of the self-refresh mode is unchanged (step S5). If setting is changed from the self-refresh mode, the self-refresh mode is quit (step S8). If setting of the self-refresh mode is unchanged, judgment is made about the number of times of the short-cycle refreshing (step S6). If the number of times is smaller than (n−1), the short-cycle refreshing is executed again in the step S4. If the number of times is equal to (n−1), the operation proceeds to the step S7 to judge whether or not setting of the self-refresh mode is changed. If setting is changed from the self-refresh mode, the self-refresh mode is quit (step S8). If setting of the self-refresh mode is unchanged, the operation returns to the step S3 to repeat the flow from the long-cycle refreshing.

Figure 4:
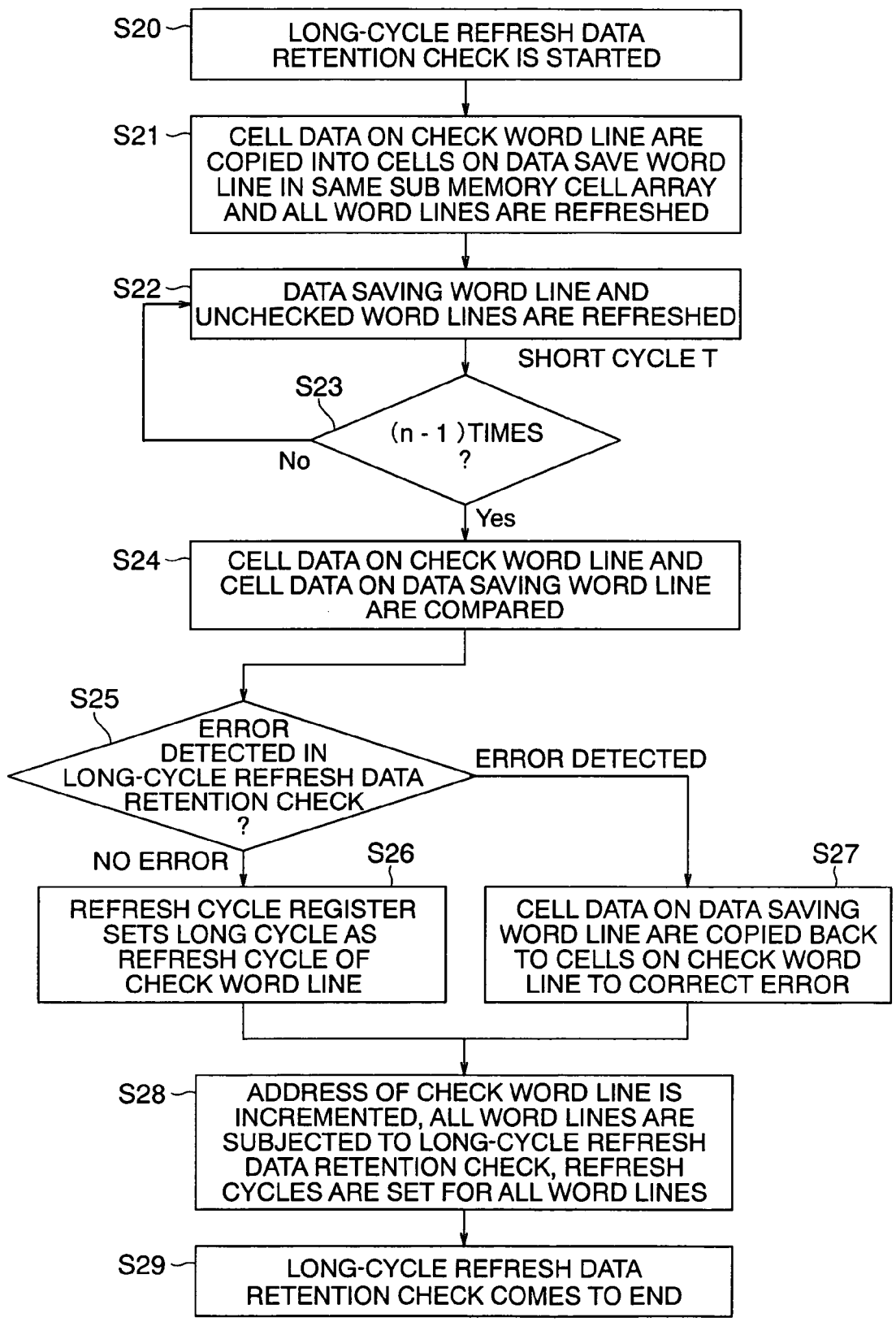
FIG. 4 is a flow chart for describing long-cycle refresh data retention check shown in FIG. 3.

Next referring to FIGS. 4 and 5, description will be made of the long-cycle refresh data retention check in the step S2 will be described in detail. In the long-cycle refresh data retention check, operation timings of the word lines and the sense amplifiers are controlled by the control signal from the long-cycle refresh data retention check control circuit 23.

In each sub memory cell array, the memory cells are arranged at intersecting points of the word lines and the bit lines, respectively, like in a typical memory device. Further, each sub memory cell array has a data saving memory cell array including a data saving word line. The memory cells on the data saving word line temporarily store, as stored memory cell data, the memory cell data on the check word line to be checked for the retention time, in order to compare the stored memory cell data with the memory cell data on the check word line. The data saving word line is selected by an address for selecting the sub memory cell array and a data saving signal.

The data saving word line newly added may be implemented by adding a new memory cell array, or by selecting a redundancy word line in a redundancy circuit and using a fuse.

The long-cycle refresh data retention check is started (step S20). Under control of the long-cycle refresh data retention check control circuit 23, the memory cell data on the check word line are written and copied into the memory cells on the data saving word line in the same sub memory cell array and, simultaneously, all word lines are refreshed (step S21).

Figure 6:
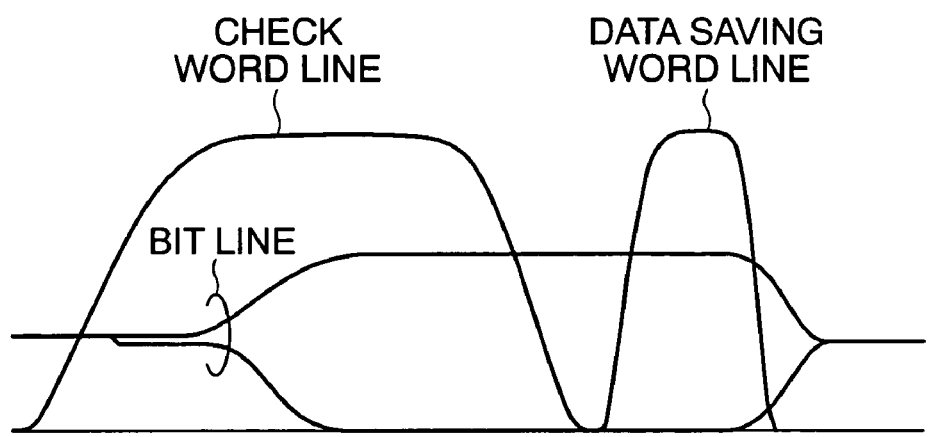
FIG. 6 is a timing chart for describing a copying operation of memory cell data.

Referring to FIG. 6, description will be made of the timing of copying the memory cell data on the check word line into the memory cells on the data saving word line. At first, the check word line is selected and raised to a high level. Then, a small potential difference is produced between the bit lines of each bit line pair due to electric charges of the memory cell data. The sense amplifiers are activated to amplify the potential differences. The bit line pairs secure the memory cell data as read data. At this time, the check word line is brought to a low level and the data saving word line is raised to a high level. Herein, the sense amplifiers are kept activated and the bit line pairs hold the read data. The read data thus held are written and copied into the memory cells on the data saving word line through the sense amplifiers. The data saving word line is brought to a low level and the sense amplifiers are inactivated. By the above-mentioned operation, all memory cell data on the check word line are simultaneously written into the corresponding memory cells on the data saving word line, respectively. Thus, the memory cell data are copied.

Figure 7:
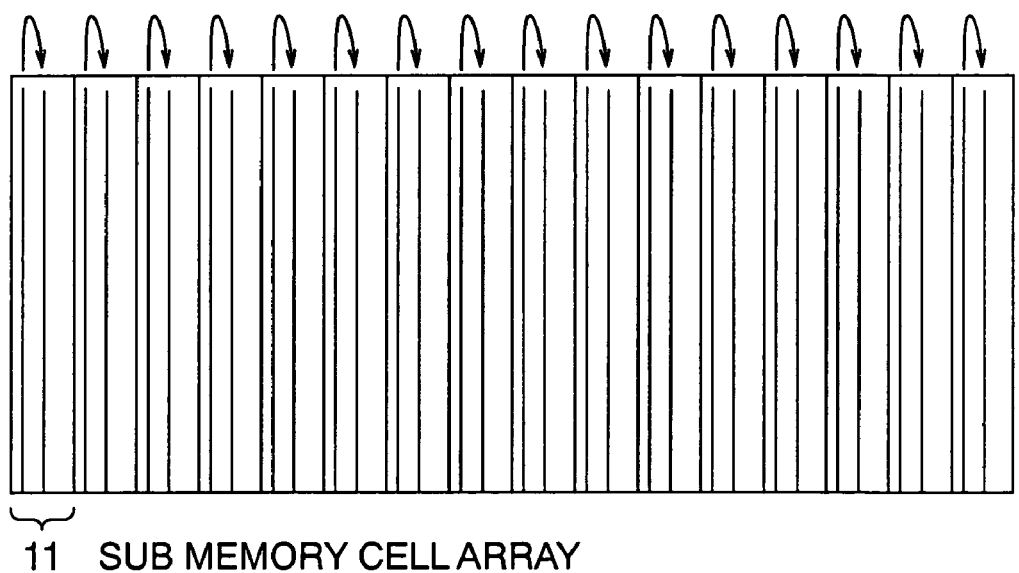
FIG. 7 is a view for describing the copying operation in a plurality of sub memory cell arrays.

As shown in FIG. 7, the above-mentioned copying operation is executed simultaneously and collectively for all of the sub memory cell arrays having the data saving word lines, respectively. When the copying operation is executed, an ordinary refresh operation is performed for all word lines by raising the word line to a high level, activating the sense amplifier, bringing the word line to a low level, and inactivating the sense amplifier After lapse of the short cycle T, the data saving word line and unchecked word lines are subjected to the short-cycle refreshing (step S22). The number of times of the short-cycle refreshing is counted (step S23). The steps S22 and S23 are repeated until the number of times of the short-cycle refreshing reaches (n−1). The data saving word line and the unchecked word lines are subjected to the short-cycle refreshing in every short cycle T. On the other hand, the check word line is refreshed once at the first time instant and is not refreshed until the lapse of the long cycle nT corresponding to n times the short cycle T.

In a step S24, comparison is made between the memory cell data on the check word line and the memory cell data on the data saving word line. The memory cell data on the check word line are read and transmitted through the data amplifiers to the data registers to be held in the data registers. Thereafter, the memory cell data on the data saving word line are read and compared with the memory cell data read from the check word line and stored in the registers. In absence of an error in the result of comparison, the retention times of the memory cells on the check word line are not shorter than the long cycle nT. In presence of an error in the result of comparison, the retention times of the memory cells on the check word line are shorter than the long cycle nT.

Figure 8:
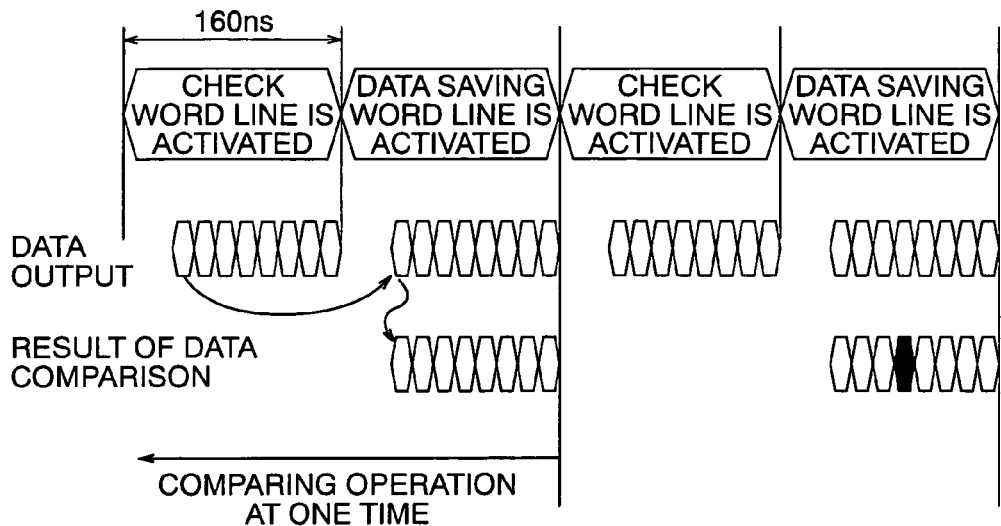
FIG. 8 is a timing chart for describing a comparing operation.
Figure 9:
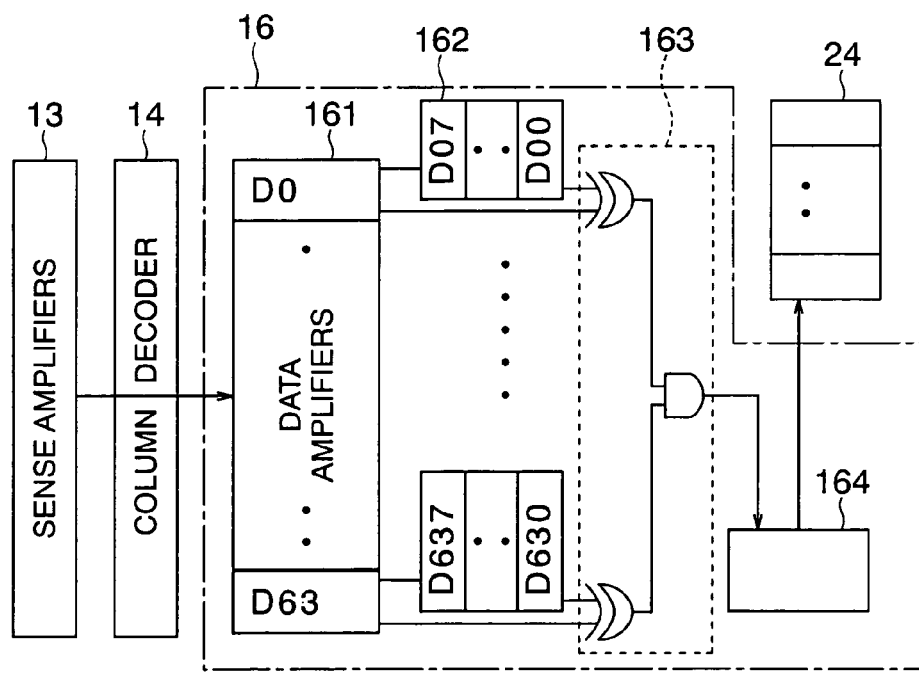
FIG. 9 is a block diagram of a data amplifier/register/comparator circuit.

The above-mentioned comparison is repeatedly carried out several times for a single word line because the number of the data amplifiers 161 is smaller than the number of the sense amplifiers. In the sub memory cell array in this embodiment, each data amplifier 161 corresponds to a 8-bit register structure as illustrated in FIGS. 8 and 9. Therefore, in a single comparing operation, each of the data amplifiers, 64 in number, executes comparison of 8 bits. Therefore, for a single word line, the comparing operation is repeated 16 times.

Figure 10:
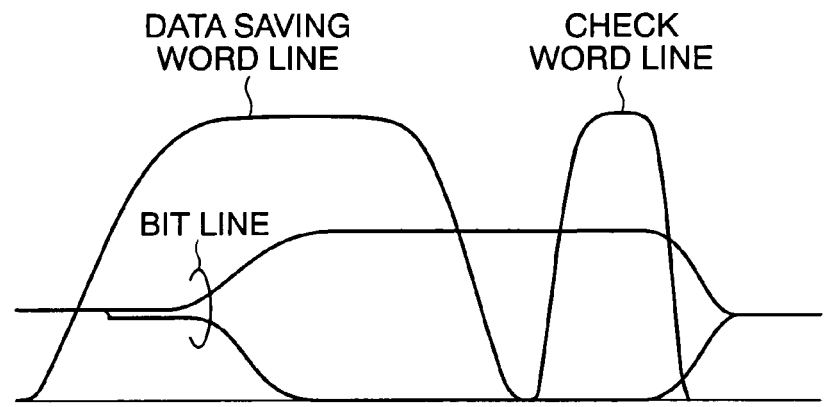
FIG. 10 is a timing chart for describing a copying back operation.

Collecting the comparison results for all memory cells on the single word line, judgment is made about whether or not an error is detected in the long-cycle refresh data retention check for the single word line (step S25). In absence of an error in all memory cells on the single word line, the retention times are not shorter than the long cycle nT and the refresh cycle setting register 24 sets the long-cycle refreshing for the check word line (step S26). If at least one error is detected in the memory cells as a result of comparison, the memory cell data on the data saving word line are rewritten and copied back into the memory cells on the check word line to correct the error in the memory cell data on the check word line, as illustrated in FIG. 10 (step S27). After completion of setting for the single word line, the address of the check word line is incremented. The long-cycle refresh data retention check is successively carried out and the refresh cycle is set for all of the word lines (step S28). Finally, the long-cycle refresh data retention check comes to an end (step S29).

Hereinafter, the steps S24 to S28 will be described more in detail with reference to FIGS. 8 and 9. As illustrated in FIG. 9, the data amplifier/register/comparator circuit 16 comprises a plurality of data amplifiers 161, a plurality of registers 162 each of which is for latching 8 cell data on the check word line, a comparator circuit 163 for comparing the cell data on the check word line and the cell data on the data saving word line, and a retention time judging circuit 164 for storing the comparison results for the data on the single word line and judging the retention times.

In FIG. 9, the sub memory cell array 11 has the sense amplifiers, 8 k in number, and the data amplifiers, 64 in number. In order to compare the memory cells on the word line by activating the word line at one time, the registers 162 must have a 128-bit structure. In that event, however, the number of bits is too many. Therefore, the 8-bit structure is adopted and comparison of the memory cell data on the single word line is carried out in 16 times. Referring to a timing chart in FIG. 8, description will be made of the comparing operation. The check word line is activated and the cell data, 8 k in number, are amplified by the sense amplifiers 13. At first, 64 data selected by the column decoder 14 among the 8 k data are transmitted to the data amplifiers 161 and stored in the respective registers 162. Next, the cell data successively selected by the column decoder 14 are transmitted to the data amplifiers 161. The respective registers 162 connected to the data amplifiers store every eight bits of the memory cell data on the check word line, i.e., D00-D07, . . . , D630-D637.

Subsequently, the data saving word line is activated. The memory cell data on the data saving word line are read and sent to the sense amplifiers 13. The column decoder 14 selects the corresponding sense amplifiers in the order of addresses similar to that when reading the memory cell data on the check word line, and transmits the memory cell data to the data amplifiers. The memory cell data on the data saving word line sent from the data amplifiers to the comparator circuit are successively compared with the data read from the check word line and stored in the registers 162. Herein, each of the registers 162 has 8 bits and is shifted by one bit in synchronization with the data sent from the column decoder 14. The memory cell data on the data saving word line and the memory cell data on the check word line corresponding to each other are compared to judge whether or not these data are identical with each other.

At this time, each memory cell on the data saving word line is refreshed in the short cycle T and therefore holds the correct cell data. On the other hand, each memory cell on the check word line is refreshed in the long cycle nT and the data may possibly be lost. These data are compared and, if these data are identical, the memory cell has the retention time not shorter than the long cycle nT. On the other hand, if these data are different, it is judged that the retention time of the memory cell does not correspond to the long cycle nT but corresponds to the short cycle T. If all of the memory cells on the check word line have the retention times not shorter than the long cycle nT, the word line is judged to have the retention time of the long cycle. If at least one memory cell on the check word line has the retention time corresponding to the short cycle, the word line is judged to have the retention time of the short cycle.

For the single word line, similar comparison and judgment are repeated 16 times in total. In FIG. 8, no error is detected as a result of the first comparison for 8 bits of the data and an error is detected in a fourth bit depicted by a black bit as a result of the second comparison. The result of error detection is latched in a latch circuit (not shown) in the comparator circuit. In the second comparison, detection of error is judged. The results of comparison, 16 in number, are stored in registers of the retention time judging circuit 164, respectively. The results of comparison are accumulated to obtain an accumulation result as the retention time for each word line. If no error is detected in all bits and the retention time for the check word line is judged to be not shorter than the long cycle nT, the refresh cycle is determined as the long cycle nT. On the other hand, if an error is detected in at least one bit and the retention time is judged to be shorter than the long cycle nT, the refresh cycle is determined as the short cycle T.

The refresh cycle signal is transmitted to the refresh cycle setting register 24 and stored as the refresh cycle setting signal for each word line. The comparing operation and the judging operation mentioned above are repeated for all of the word lines and the refresh cycle setting signals for all the word lines are stored in the refresh cycle setting register 24. Thus, setting of the long-cycle refresh data retention check is completed. The refresh cycle setting register 24 holds the refresh cycle setting signals in the order of the addresses generated by the refresh address generating circuit 22. Therefore, address information can be omitted.

Figure 11:
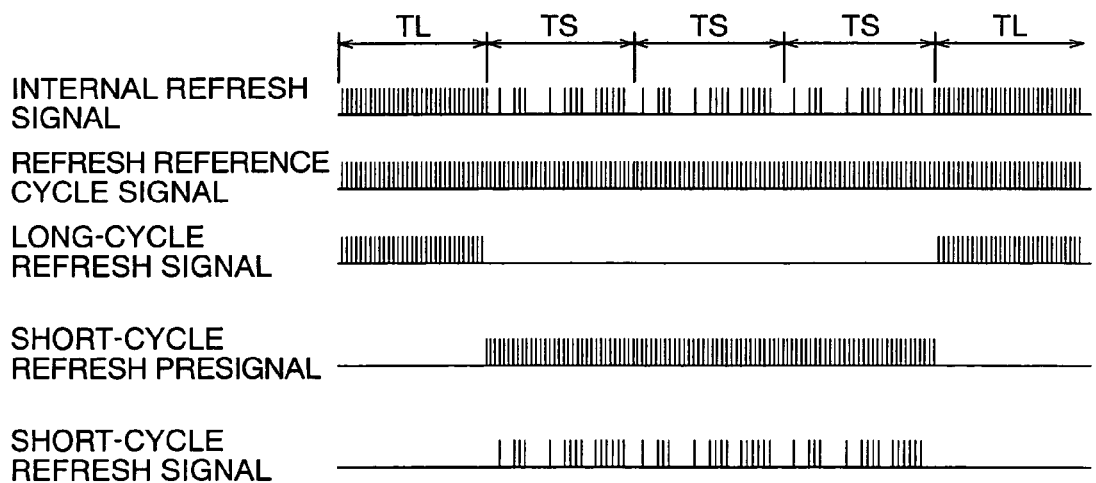
FIG. 11 is a timing chart for describing the refresh operation.

Referring to FIG. 11, the long-cycle refreshing (step S3) and the short-cycle refreshing (step S4) will be described. It is assumed here that the ratio n of the long cycle nT with respect to the short cycle T is equal to 4. Therefore, after the long-cycle refreshing is executed once in a period TL, the short-cycle refreshing is repeated three times in periods TS. Thereafter, the long-cycle refreshing is executed again.

The operation of the self-refresh control circuit 20 in FIG. 2 will be described. The refresh cycle generating oscillator circuit 21 generates the refresh reference cycle signal. The refresh reference cycle signal is included the long-cycle refresh signal in the period TL and the short-cycle refresh presignal in the period TS. The long-cycle refresh signal and the short-cycle refresh presignal are supplied to the refresh address generating circuit 22. In synchronization with these signals, the refresh addresses are successively incremented to generate new refresh addresses. The new refresh addresses are delivered to the long-cycle refresh data retention check control circuit 23, the refresh cycle setting register 24, and the array control circuit 15.

In case where the short-cycle refresh presignal is supplied, the refresh cycle setting register 24 produces the short-cycle refresh signal if the word lines corresponding to the refresh addresses are set to the short-cycle refreshing and does not produce the short-cycle refresh signal if the word lines corresponding to the refresh addresses are set to the long-cycle refreshing. Therefore, the short-cycle refresh signal is delivered only to those addresses set to the short-cycle refreshing as shown in FIG. 11. The logical circuit 26 is supplied with the long-cycle refresh signal and the short-cycle refresh signal. If either one of the long-cycle and the short-cycle refresh signals is activated, the logical circuit 26 delivers the control signal for starting the refresh operation to the refresh signal generating circuit 25. The refresh signal generating circuit 25 delivers the internal refresh signal to the array control circuit 15.

In case where the internal refresh signal is received, the array control circuit 15 activates the word lines corresponding to the input addresses to perform the refresh operation. In absence of the internal refresh signal, the corresponding word lines are inactivated and are not refreshed.

When the refresh cycle is set for all of the word lines in the long-cycle refresh data retention check (step S2), the long-cycle refreshing in the period TL is executed (step S3). In response to the long-cycle refresh signal produced by the refresh cycle generating oscillator circuit 21, the logical circuit 26 produces the control signal for starting the refresh operation in correspondence to all addresses. Similarly, the refresh signal generating circuit 25 produces the internal refresh signal corresponding to all addresses. In the period TL during which the long-cycle refreshing is performed, all word lines are refreshed.

In the period TS, the short-cycle refreshing is executed (step S4). The short-cycle refresh signal produced by the refresh cycle setting register 24 is activated only for the addresses set to the short-cycle refreshing. The internal refresh signal from the refresh signal generating circuit 25 is activated in correspondence to a part of the addresses set to the short-cycle refreshing. In the period TS in which the short-cycle refreshing is performed, the refresh operation is performed only for the word lines set to the short-cycle refreshing. In the second and the third periods TS, the short-cycle refreshing is similarly performed.

Thus, in the short-cycle refreshing, only the word lines corresponding to a part of the addresses are refreshed while the word lines having the long-cycle retention times are not refreshed. As a reduced number of the word lines are refreshed, current consumption in the refresh operation can be saved. For example, the refresh current is 1 mA when the short cycle T is 64 ms. If the refresh cycle is 256 ms corresponding to four times the short cycle of 64 ms, the refresh current is 300 μA. If the refresh cycle is 1024 ms, the refresh current is reduced to 80 μA.

As described above, the semiconductor memory device according to this invention achieves a power saving mode. The refresh mode in this invention or the ordinary refresh mode in a fixed cycle may be selected during use by setting a mode register or by operating an address key upon entry into the refresh mode. In this manner, the power saving mode can be set.

While this invention has thus far been described in connection with the preferred embodiment thereof, it will be readily possible for those skilled in the art to put this invention into practice in various other manners without departing from the scope set forth in the appended claims. For example, although two refresh cycles including the short cycle and the long cycle are used in the embodiment, three or more cycles may be applied. Further, it is possible to differ the lengths of the cycle upon retention check and the cycle upon refreshing from each other in order to ensure the refresh operation.

In this invention, the retention times of the memory cells for the cell data patterns written in the memory cells are measured upon entry into the refresh mode. The refresh operation is carried out in a plurality of different cycles corresponding to the retention times. Thus, the refresh current is saved. As the retention times of the memory cells are measured, it is possible to eliminate an influence of variation in retention time of the data patterns written in the memory cells due to the data patterns in adjacent memory cells. According to this invention, the semiconductor memory device and the method of refreshing the semiconductor memory device which are capable of carrying out a reasonable, reliable, and low-power-consumption refresh operation are obtained.

What is claimed is:

1. A semiconductor memory device including a plurality of memory cells,
    wherein, when the semiconductor memory device enters a refresh mode, retention times of the memory cells are measured by a control circuit with respect to data patterns which are stored in the memory cells at the time of entry into the refresh mode,
    wherein the memory cells are arranged in a matrix fashion to form a sub memory cell array, said sub memory cell array comprising a check word line and a data saving word line, and wherein memory cell data on the check word line is copied through sense amplifiers to memory cells on the data saving word line.

2. The semiconductor memory device according to claim 1, wherein a plurality of refresh cycles corresponding to the retention times are set and a refresh operation is performed according to the refresh cycles.

3. The semiconductor memory device according to claim 2, wherein the refresh cycles include a short cycle T and a long cycle nT corresponding to n times the short cycle T, n being an integer greater than or equal to two.

4. The semiconductor memory device according to claim 1, wherein memory cell data on the data saving word line are copied back to the memory cells on the check word line.

5. The semiconductor memory device according to claim 1, wherein the memory cells on the data saving word line are subjected to short-cycle refreshing while the check word line is subjected to long-cycle refreshing, the memory cell data on the data saving word line being thereafter compared with the memory cell data on the check word line.

6. The semiconductor memory device according to claim 5, wherein the long-cycle refreshing or the short-cycle refreshing is set for each word line of the sub memory cell array with reference to the result of comparison and refreshing is performed.

7. The semiconductor memory device according to claim 6, wherein each word line of the sub memory cell array is refreshed at a first instant, and each word line set for short cycle refreshing is refreshed after a lapse of a short cycle T, while each word line set for long cycle refreshing is refreshed only after a lapse of a long cycle nT, corresponding to n times the first time T, wherein n is an integer greater than or equal to 2.

8. The semiconductor memory device according to claim 6, wherein short cycle refreshing is set for each word line of the sub memory cell array for which an error is detected as the result of comparison, and long cycle refreshing is set for each word line of the sub memory cell array for which no error is detected as the result of comparison.

9. The semiconductor memory device according to claim 1, wherein the sub memory cell array includes a data saving memory cell array having the data saving word line.

10. The semiconductor memory device according to claim 9, further comprising a comparator circuit for comparing data of the memory cells on a check word line to be subjected to measurement of the retention times and data of memory cells on the data saving word line.

11. The semiconductor memory device according to claim 9, further comprising a comparator circuit for comparing output data of registers for holding data of the memory cells on a check word line to be subjected to measurement of the retention times and output data from data amplifiers for outputting data of memory cells on the data saving word line.

12. The semiconductor memory device according to claim 11, further comprising a retention judging circuit for judging the retention time of the check word line with reference to output information from the comparator circuit, the output information representing coincidence/incoincidence for the memory cells on the check word line.

13. The semiconductor memory device according to claim 12, further comprising a refresh cycle setting register for holding a refresh cycle setting signal from the retention judging circuit.

14. The semiconductor memory device according to claim 9, wherein the data saving word line is provided by selecting a redundancy word line of a redundancy circuit.

15. A method of refreshing a semiconductor memory device, the method comprising:
    making the semiconductor memory device enter a refresh mode;
    measuring retention times of memory cells for each word line with respect to data patterns which are stored in the memory cells;
    setting a plurality of refresh cycles corresponding to the retention times;
    carrying out a refresh operation according to the refresh cycles; and
    copying memory cell data on a check word line of the sub memory cell array into memory cells on a data saving word line.

16. The method according to claim 15, wherein the refresh cycles include a short cycle T and a long cycle nT corresponding to n times the short cycle T, n being an integer greater than or equal to two.

17. The method according to claim 15, the semiconductor memory device including a sub memory cell array comprising the memory cells arranged in a matrix fashion, the method further comprising:
    long-cycle refreshing the check word line and the data saving word line;
    short-cycle refreshing the data saving word line;
    reading the memory cell data on the check word line and storing the memory cell data into registers; and
    comparing the memory cell data on the data saving word line and the memory cell data read from the check word line and stored in the registers.

18. The method according to claim 17, further comprising setting long cycle refreshing or short cycle refreshing for each word line in the sub memory cell array in reference to the result of comparison.

* * * * *